United States Patent
Yoda et al.

(10) Patent No.: US 6,831,283 B2
(45) Date of Patent: Dec. 14, 2004

(54) CHARGED PARTICLE BEAM DRAWING APPARATUS AND PATTERN FORMING METHOD

(75) Inventors: Haruo Yoda, Nishitama-gun (JP); Hajime Kawano, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/364,424

(22) Filed: Feb. 12, 2003

(65) Prior Publication Data

US 2003/0146397 A1 Aug. 7, 2003

Related U.S. Application Data

(63) Continuation of application No. 09/499,311, filed on Feb. 7, 2000, now Pat. No. 6,237,495.

(30) Foreign Application Priority Data

Feb. 18, 1999 (JP) .............................. 11-039749

(51) Int. Cl.[7] ................................................ G03F 7/20
(52) U.S. Cl. .............................. 250/492.22; 250/492.2; 250/492.1
(58) Field of Search ....................... 250/492.22, 492.2, 250/492.1, 492.3

(56) References Cited

U.S. PATENT DOCUMENTS

| | | | |
|---|---|---|---|
| 5,149,975 A | 9/1992 | Yoda et al. | 250/492.2 |
| 5,278,421 A | 1/1994 | Yoda et al. | 250/492.22 |
| 5,313,068 A | 5/1994 | Meiri et al. | 250/492.22 |
| 5,644,138 A | 7/1997 | Hamaguchi | 250/492.22 |
| 5,667,923 A | 9/1997 | Kanata | 430/30 |
| 6,087,052 A * | 7/2000 | Manabe et al. | 430/30 |
| 6,243,487 B1 * | 6/2001 | Nakajima | 382/144 |

FOREIGN PATENT DOCUMENTS

| | | |
|---|---|---|
| JP | 61-284921 | 12/1986 |
| JP | 05-160010 | 6/1993 |
| JP | 06-208944 | 7/1994 |
| JP | 07-078737 | 3/1995 |
| JP | 07-086124 | 3/1995 |
| JP | 07-094379 | 4/1995 |
| JP | 08-037140 | 2/1996 |
| JP | 08-213315 | 8/1996 |
| JP | 10-229047 | 8/1998 |

OTHER PUBLICATIONS

Geraint Owen and Paul Rissman: *Proximity effect correction for electron beam lithography by equalization of background dose*; J. Appl. Phys. 54 (6), Jun. 1983.

* cited by examiner

Primary Examiner—Nikita Wells
Assistant Examiner—Anthony Quash
(74) Attorney, Agent, or Firm—Kenyon & Kenyon

(57) ABSTRACT

A charged particle beam drawing apparatus and a pattern forming method capable of drawing fine patterns while minimizing the proximity effect, thus overcoming the drawbacks of the conventional exposure area density correcting method and supplementary exposure method. The inventive method comprises the steps of performing supplementary exposure by irradiating a drawing area on a specimen with a charged particle beam, and performing main exposure by irradiating with the charged particle beam a region made up of the drawing pattern inside the drawing area on the specimen. The supplementary exposure step includes the steps of: dividing the drawing area into a plurality of smaller regions of an equal area each while calculating an area value of the drawing pattern in each smaller region; correcting the area value of each smaller region by use of a weighted sum of the area values calculated for proximate smaller regions surrounding the smaller region in question; generating supplementary exposure geometries for the drawing area; and computing doses of exposure for the generated supplementary exposure geometries by referring to the corrected area values.

12 Claims, 9 Drawing Sheets

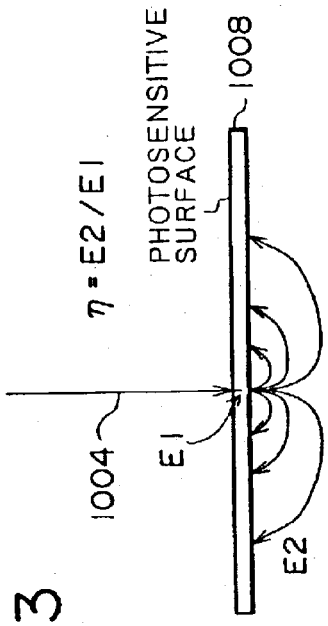
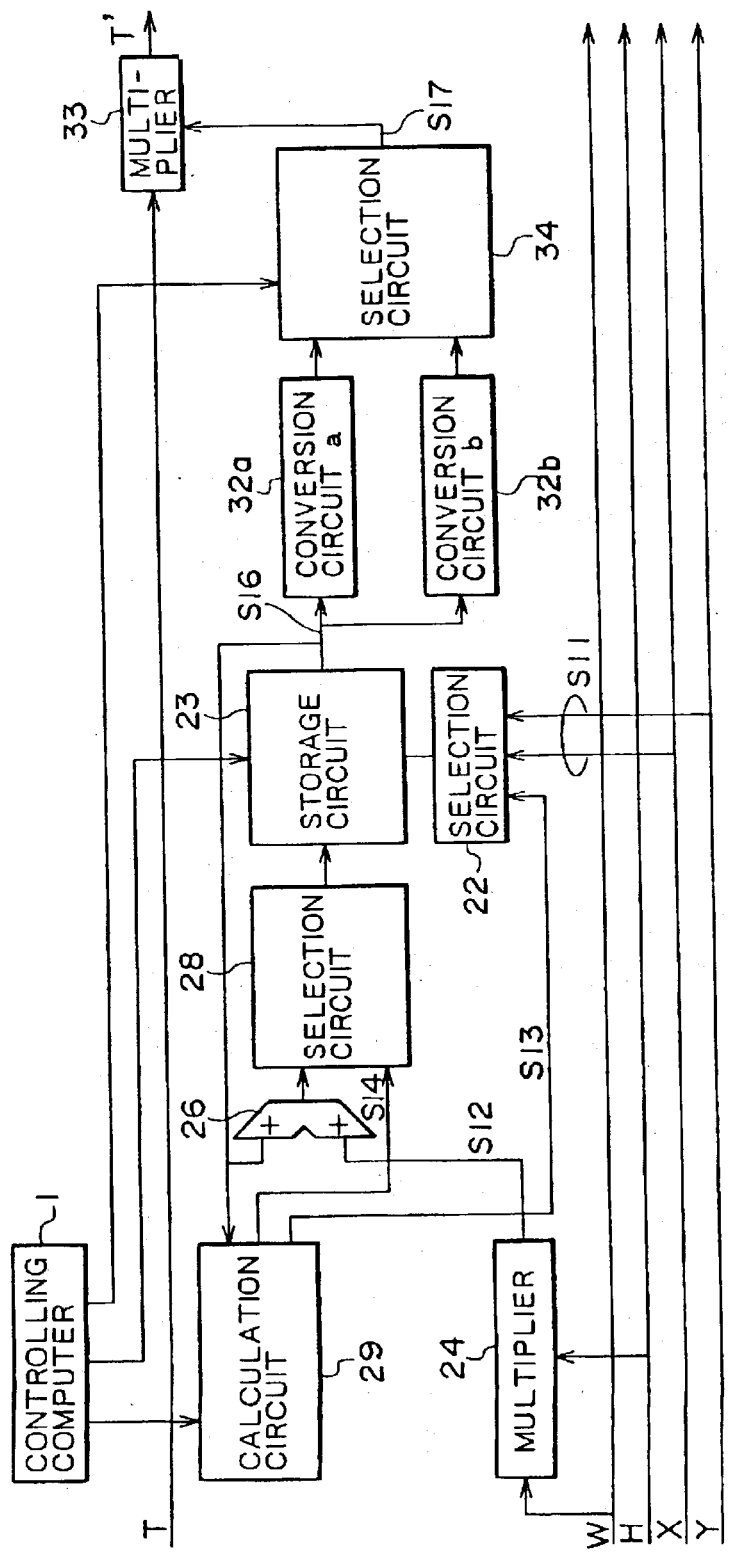

CHARGED PARTICLE BEAM DRAWING APPARATUS AND PATTERN FORMING METHOD

FORMING METHOD

This is a continuation of application Ser. No. 09/499,311 filed Feb. 7, 2000, now abandoned the content of which is incorporated herein by reference in its entirety.

FIELD OF THE INVENTION

The present invention relates to a charged particle beam drawing apparatus and a pattern forming method for drawing fine patterns by use of a charged particle beam. More particularly, the invention relates to a charged particle beam drawing apparatus and a pattern forming method suitable for fabricating semiconductor integrated circuits having extremely high degrees of integration.

BACKGROUND OF THE INVENTION

The ever-expanding electronics industry is witnessing the rapid miniaturization of circuit patterns fabricated in semiconductor integrated circuits. Ever-finer patterns have been formed through widespread use of drawing methods based on a charged particle beam for higher resolution. One drawback of the typical charged particle beam drawing method is that the speed of drawing is low compared with methods for transferring circuit patterns through masks using a light beam. The disadvantage of reduced drawing speeds, however, has been gradually alleviated since the successful commercial use of a method for making comprehensive drawing of fine pattern areas about five to 10 micrometers square each.

Where circuit patterns are formed by use of a charged particle beam, attempts to draw ever-finer patterns can result in inaccurately formed line widths and/or gaps which are flanked by large and fine geometries or which are located at portions whose dimensions change abruptly. This phenomenon has turned out to be a major problem in the formation of refined patterns. The problem, called the proximity effect, must be resolved before the fine pattern forming method using a charged particle beam can work effectively. The cause of the phenomenon is well known: an emitted charged particle beam passes through a sensitive material (called the resist hereunder) to enter a semiconductor substrate from which part of the charged particles backward-scattered inside return to the resist for further exposure. The returning charged particles called backward-scattered particles exert the same effect brought about when a wide, fuzzy drawing pattern is exposed to feeble light. Additional exposure caused by the backward-scattered particles leads to overexposure of regions where the density of pattern drawing is high. The result is the phenomenon of the incorrectly formed line widths and gaps mentioned above.

As a way of minimizing the proximity effect, the inventors of this invention has proposed an exposure area density method in Japanese patent Laid-open No. Hei 3-225816. The proposed method involves dividing beforehand the entire drawing area into a plurality of smaller regions and calculating the exposure area density in each of the divided smaller regions. The exposure time is then made shorter for the smaller regions in which the exposure area density is relatively high, and made longer for the smaller regions in which the exposure area density is relatively low.

Another way of minimizing the proximity effect is what is known as the auxiliary exposure method discussed illustratively by G. Owen and P. Rissman in "Proximity effect correction for electron beam lithography by equalization of background dose" (J. Appl. Phys., Vol. 54, No. 6, pp. 3573–3581; June 1983). According to this method, the exposed and unexposed portions of a drawing pattern are reversed to form an inverted pattern. The inverted pattern is reexposed to a defocused charged particle beam in a supplementary fashion to make uniform reexposure levels of backward scattering over the entire reexposed area (the procedure is called supplementary exposure), whereby the proximity effect is minimized. Japanese patent Laid-open No. Hei 5-160010 discloses a technique for determining the intensity of supplementary exposure for each of the divided smaller regions in proportion to its pattern area.

The exposure area density method above works on the principle of making drawing while correcting the exposure time for each of smaller regions using calculated values of region-by-region exposure area densities that vary depending on the position of drawing. Where each fine pattern of a certain size is transferred as a whole before being drawn, each pattern transferred in a lump constitutes a drawn geometry of a single smaller region, so that the exposure time of the smaller region in question is controlled at a constant level. In that case, in any one of the proximate smaller regions around the smaller region in question, there can be a discrepancy between the actual exposure time and an ideal exposure time. This phenomenon is conspicuous if patterns each transferred in a lump have large dimensions, and is particularly pronounced at portions where the exposure area density varies abruptly. As a result, some of the finished fine patterns fail to comply with the required dimensions.

According to the supplementary exposure method above, the effects of backward scattering are smoothed out by supplementary exposure. While minimizing incorrectly finished dimensions, this method requires two things: huge quantities of drawing data representing the inverted pattern must be prepared before exposure of that pattern, and a new set of equipment is needed to defocus the charged particle beam for irradiation. To meet these requirements takes time and thereby lowers throughput, i.e., reduces efficiency in dealing with individual wafers one by one. Furthermore, the supplementary exposure method involves having supplementary exposure carried out a number of times even if the exposure area density is relatively low. This often leads to the problem of the beam apparatus body tube being inordinately charged up.

SUMMARY OF THE INVENTION

It is therefore an object of the present invention to overcome the drawbacks and deficiencies of the conventional exposure area density method and supplementary exposure method and to provide a charged particle beam drawing apparatus and a pattern forming method capable of drawing fine patterns while minimizing the proximity effect.

In carrying out the invention and according to one aspect thereof, there is provided a pattern forming method comprising the steps of performing supplementary exposure by irradiating a drawing area on a specimen with a charged particle beam, and performing main exposure by irradiating with the charged particle beam a region made up of the drawing pattern inside the drawing area on the specimen. The supplementary exposure step includes the steps of: dividing the drawing area into a plurality of smaller regions of an equal area each while calculating an area value of each smaller region exposed to the charged particle beam; correcting the area value of each smaller region by use of a weighted sum of the area values calculated for proximate smaller regions surrounding the smaller region in question; generating supplementary exposure geometries for the plurality of smaller regions; and computing a dose of exposure for the generated supplementary exposure geometries by referring to the corrected area values.

Other objects, features and advantages of the invention will become more apparent upon a reading of the following description and appended drawings.

BRIEF DESCRIPTION OF THE DRAWINGS

Preferred embodiments of the present invention will be described in detail with reference to the following figures wherein:

FIG. 3 is a cross-sectional view of a specimen under irradiation by an electron beam;

FIG. 4 is a function block diagram of a proximity effect correction circuit;

DETAILED DESCRIPTION OF THE PREFERRED EMBODIMENTS

Figure 1:
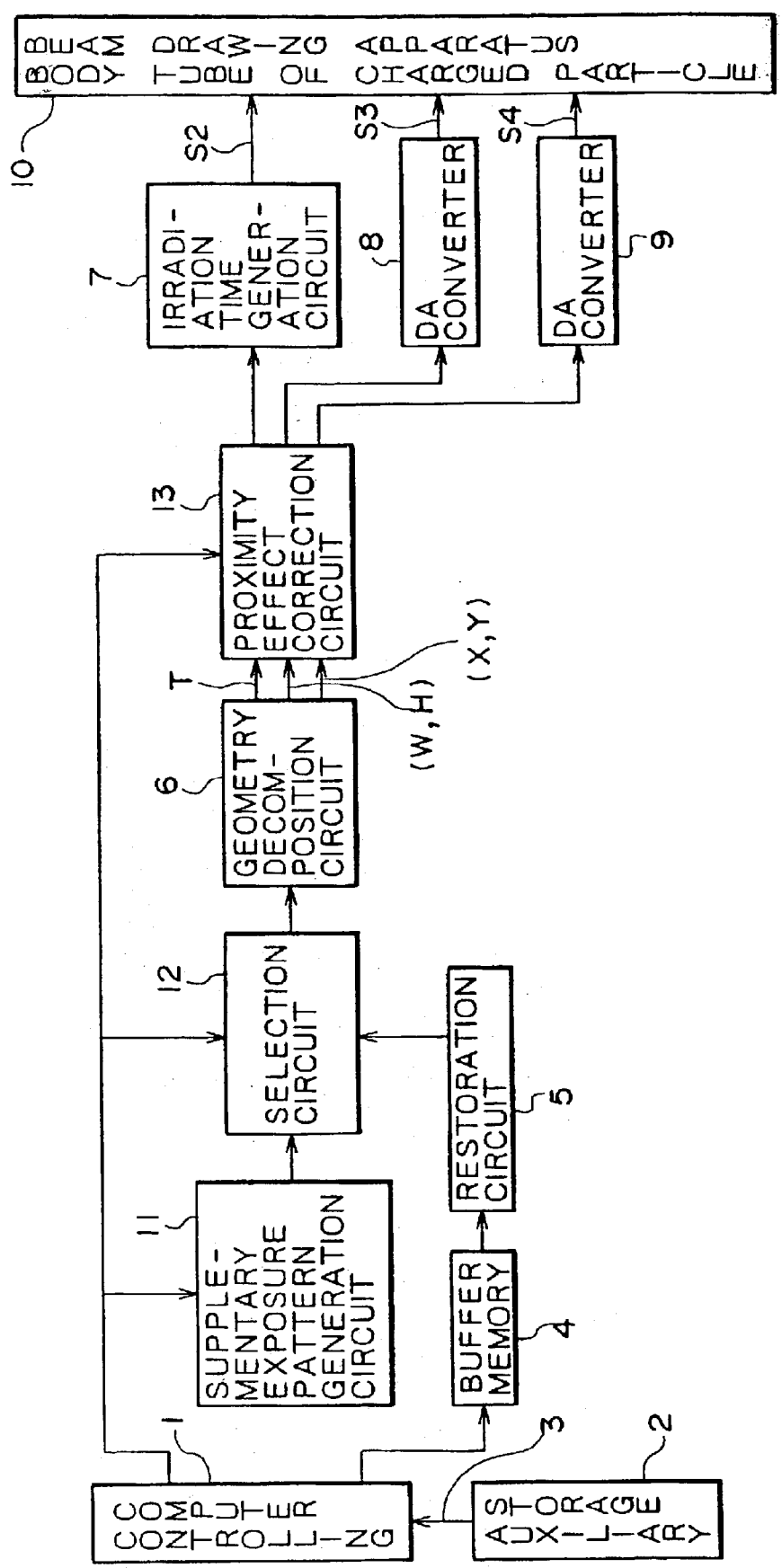
FIG. 1 is a block diagram of a variable shaped charged particle beam drawing apparatus with its major components.

As one embodiment of this invention, there is provided a pattern forming method for having a drawing pattern exposed onto a specimen by irradiation with a charged particle beam, the method comprising the steps of performing main exposure by irradiating with the charged particle beam a portion constituted by the drawing pattern on the specimen, and performing supplementary exposure by irradiating the entire drawing area over the specimen with the charged particle beam. The step of supplementary exposure over the whole drawing area further includes the steps of: dividing the drawing area into a plurality of smaller regions of an equal area each; calculating an area value of the drawing pattern in each smaller region; correcting the area value of each smaller region by use of a weighted sum of the area values calculated for proximate smaller regions surrounding the smaller region in question; generating a plurality of supplementary exposure geometries for the entire drawing area; and determining doses of exposure for the generated supplementary exposure geometries by referring to the corrected area values.

As another embodiment of the invention, there is provided a pattern forming method for decomposing the entire target pattern area to be drawn, regarded as a supplementary exposure pattern, into supplementary exposure geometries each capable of being drawn in a single pass of exposure. As with the exposure area density method, the inventive method includes the steps of referring, for each supplementary exposure geometry, to an area density computed beforehand based on the drawing pattern in question; determining an exposure time to be shorter if the area density at the location of a given supplementary exposure geometry is relatively high; and determining the exposure time to be longer if the area density is relatively low.

As a further embodiment of the invention, there is provided a variation of the exposure area density method combined with supplementary exposure to constitute a novel pattern forming method. This method involves having the exposure area density method supported by a procedure of supplementary exposure involving relatively small doses of irradiation.

As an even further embodiment of the invention, there is provided a charged particle beam drawing apparatus comprising a unit which divides a target drawing pattern into a plurality of smaller regions and which computes a dose of exposure for each of the divided smaller regions, and a device which stores the computed doses of exposure corresponding to the smaller regions. Such a unit is implemented illustratively by use of a control circuit alone in the charged particle beam drawing apparatus, the circuit being operated prior to actual drawing to compute a cross-sectional area of a charged particle beam for a geometry to be drawn using a signal for controlling the shape of the charged particle beam. The computed cross-section areas are added up for each of the smaller regions. The accumulated cross-sectional area corresponds to the total dose of exposure for each of the smaller regions. If the smaller regions have a known identical area each, the accumulated cross-sectional area value may be regarded as representative of an exposure area density. On a common charged particle beam drawing apparatus, the target pattern to be drawn is usually divided into non-overlapping smaller exposure geometries subject to exposure. The setup permits rapid calculation of correct exposure area densities through the use of a simplified additional circuit.

When the area density for each of the smaller regions has been computed, the density data regarding the smaller regions are smoothed out illustratively by a weighted averaging process involving area values computed for proximate smaller regions which surround each smaller region and which exert the proximate effect to the smaller region in question. The exposure area density of each smaller region is thus corrected so as to minimize the difference in exposure area density between each smaller region and its surrounding proximate smaller regions. This allows a defocused drawing pattern stemming from exposure to backward scattering inside the substrate to be reflected as an additional tendency in the corrected exposure area density.

At the time of actual drawing, the location of each drawing geometry is read from a drawing control circuit, and a smaller region comprising the geometry in question is detected thereby. For a smaller region whose exposure area density is high, the exposure time is shortened; for a smaller region whose exposure area density is low, the exposure time is prolonged. Since the regions having high exposure area densities tend to be excessively exposed due to backward scattering, shortening the exposure time for the corresponding drawing geometries provides appropriate doses of exposure. This makes it possible to compensate for geometrical deviations attributable to the proximity effect.

It is also possible to read not only the exposure area density of each smaller region to which the target geometry belongs, but also the exposure area densities of the proximate regions around each smaller region. This allows the exposure area density corresponding to the location of the geometry in question to be computed more accurately through interpolation. The proximity effect is thus corrected in a smoother and more precise manner than before with regard to the changes of geometrical locations.

The above-described aspects of the pattern forming method have in fact been proposed already as part of the exposure area density method disclosed in Japanese patent Laid-open No. Hei 3-225816. The present invention intends to expand on the exposure area density method cited above, offering novel supplementary exposure processes to be described below. The invention also proposes a novel pattern drawing method combining the exposure area density method with supplementary exposure processes.

In principle, a supplementary exposure method according to the invention covers the entire pattern area to be drawn. First, the target pattern area to be drawn is regarded as a supplementary exposure pattern that is divided into smaller supplementary exposure geometries which may each be drawn in a single pass of exposure. As with the conventional exposure area density method, the exposure area density computed beforehand based on the drawing pattern is referenced for each supplementary exposure geometry. A supplementary exposure time is then determined in such a manner that if the exposure area density at the location of the supplementary exposure geometry is high, the exposure time is shortened; and if the exposure area density is low, the exposure time is prolonged.

In the above-described fashion, a relatively small dose of supplementary exposure is given where the exposure area density is high entailing an increased exposure due to backward scattering, and a relatively high dose of supplementary exposure is given where the exposure area density is low with a reduced exposure caused by backward scattering. This smoothes out the effects of backward scattering irrespective of geometry densities, whereby approximately the same benefits as those of the above-described supplementary exposure method are acquired. Furthermore, because the exposure area density of each smaller region and those of the proximate smaller regions surrounding it are averaged, there is no need for defocusing the charged particle beam for drawing and thus no need for a defocusing device, which used to be a necessity for the conventional supplementary exposure method.

As described, the invention adopts a novel supplementary exposure method based on exposure area density, eliminating the need for installing additional means to defocus the charged particle beam for exposure. Since there is no need for preparing large quantities of drawing data, i.e., inverted pattern data for supplementary exposure, the drawing apparatus can be reduced appreciably in size, which turns out to be a major benefit.

Furthermore, the invention combines an exposure area density method with a procedure of supplementary exposure to offer a novel drawing method. The new method adopts supplementary exposure using relatively small irradiation doses as an auxiliary function to the exposure area density method. The inventive combination method, when applied where the exposure area density of the drawing geometry changes abruptly from one region to another, makes it possible to intensify supplementary exposure in the region of the lower exposure area density. This eases fluctuations in optimum irradiation times that are necessary for the exposure area density method. As a result, despite the irradiation of a large drawing geometry in a single pass of exposure, variations of the optimum irradiation time inside the geometry are limited, and deviations from required line widths within the geometry are minimized. Since making the area of a block irradiation pattern as large as possible is an important contributing factor to boosting throughput, the inventive method is effective in writing large drawing geometries with high precision.

Because the inventive supplementary exposure process takes less irradiation time than the conventional supplementary exposure method, the deterioration in throughput formerly attributed to supplementary exposure is averted and the possibility of defects in drawing caused by a charged-up apparatus body tube is minimized. Practical benefits of the invention are all the more pronounced because there is no need, as mentioned, for large quantities of supplementary exposure designation data corresponding to the inverted drawing pattern for supplementary exposure.

Also according to the invention, optimum correction of the proximity effect is made possible even where an underlayer pattern composed of a different material is already formed on the specimen surface subject to drawing. The presence of an underlayer pattern of a dissimilar material on the specimen leaves the intensity of backward scattering variable depending on the density of the underlayer pattern during drawing. This in turn alters the optimum irradiation time of the charged particle beam for correcting the proximity effect. In such a case, the exposure area density of the underlayer pattern is acquired beforehand along with the exposure area density of the drawing pattern. An optimum irradiation time for one or both of the exposure area density method and the supplementary exposure method is then determined by referring to the exposure area density of the drawing pattern and to that of the underlayer pattern. This provides the optimum irradiation time for correcting the proximity effect. The presence or absence of an underlayer pattern has a large impact on the irradiation time particularly if that pattern is formed by a heavy metal thin film. In this respect, the inventive method is especially effective in forming uniform, fine patterns all over the drawing pattern.

One conventional technique for determining the intensity of supplementary exposure in accordance with the pattern area per smaller region is disclosed in the above-cited Japanese patent Laid-open No. Hei 5-160010. In contrast to the disclosed technique, this invention includes means for correcting the area value of each smaller region by use of a weighted sum of the area values of proximate smaller regions surrounding the smaller region in question. Because the distribution of the area values to be referenced represents an energy distribution of the backward scattering caused by main exposure, there is no need to defocus the charged particle beam for supplementary exposure as was the case with the conventional technique. Heretofore, many correcting means were needed in practice to defocus the charged particle beam in keeping with backward scattering geometries for precise irradiation onto a target position. The invention eliminates the need for such defocused exposure, offering a significant advantage in practical terms.

Figure 10:
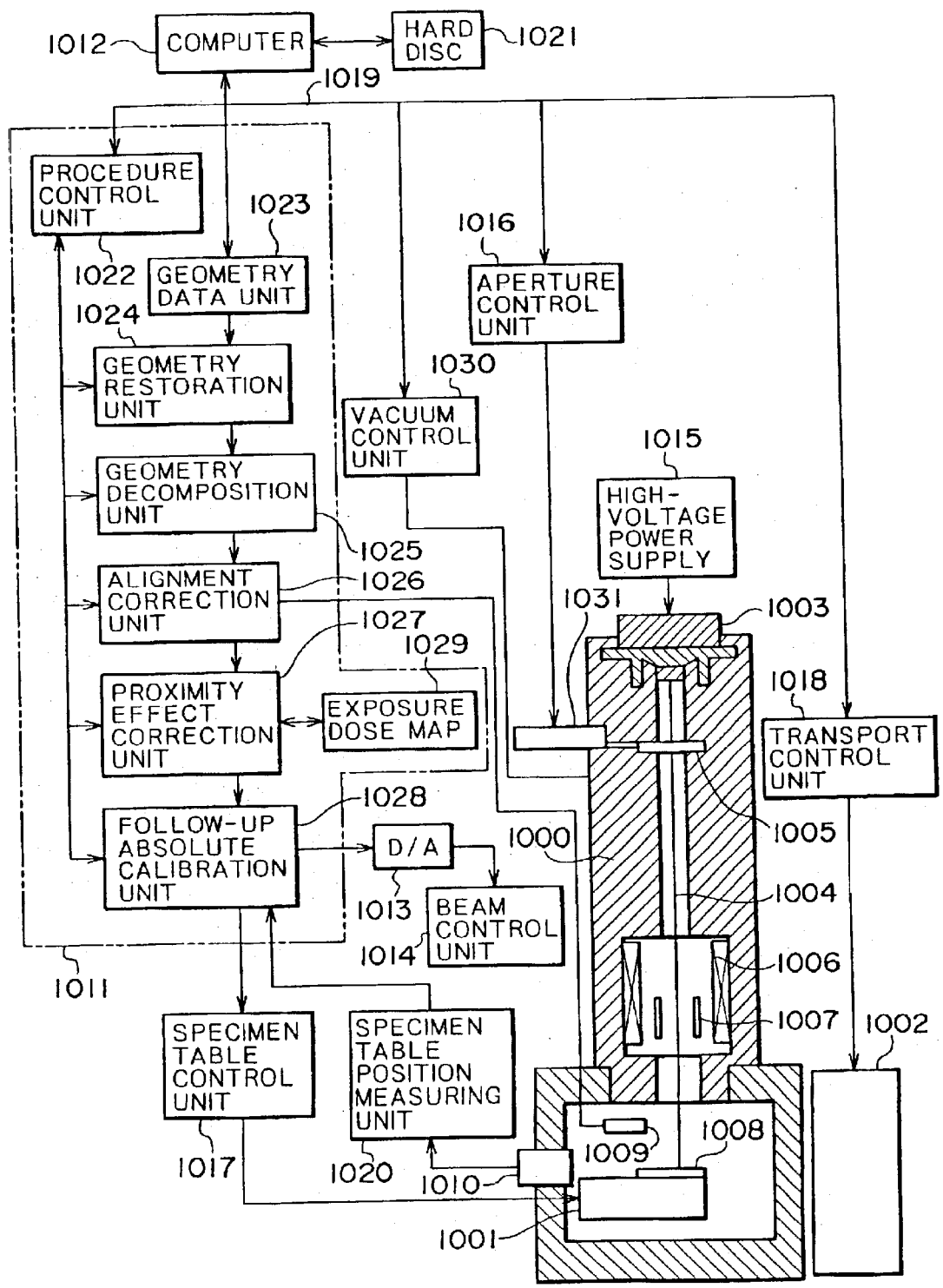
FIG. 10 is a cross-sectional view of a variable shaped charged particle beam drawing apparatus embodying the invention.

Some typical embodiments of the invention will now be described. FIG. 10 is a cross-sectional view of a variable shaped charged particle beam drawing apparatus using an electron beam as a charged particle beam. Shown on the right in FIG. 10 is a cross-section of an electron beam body tube 1000 for drawing wafers, masks and reticles. Rectangular blocks around the body tube 1000 denote functions for body tube-related control. A specimen 1008 is transported by a transport unit 1002 onto a specimen table 1001 inside the electron beam body tube 1000. An electron gun 1003 at the top of the body tube 1000 emits an electron beam 1004 downward. The emitted electron beam 1004 is rectified in shape by lenses 1006 inside the body tube and deflected by a deflector 1007 made of an electromagnetic deflector and an electrostatic deflector before being irradiated onto a target position of the specimen 1008 on the specimen table 1001. A number of cross-sectional shapes of the irradiated electron beam 1004 may be transferred onto the specimen 1008 by selectively switching apertures 1005.

On the left in FIG. 10 are blocks or units of functions for system-related control. These function blocks or units control the entire system and interface with the outside. A hard disc 1021 retains pattern data to be drawn which are transmitted by a computer 1012. A group of blocks enclosed by a frame 1011 is a group of digital processing blocks that constitute a control system for translating pattern data from the computer 1012 into electron beam deflection data continuously at high speed on a pipeline basis. The block group is connected to other control units via a bus 1019 that serves as a data line. The processing units shown in FIG. 10 carry out their functions as follows:

(1) A geometry data unit 1023 stores compressed pattern data sent from the computer 1012.
(2) A geometry restoration unit 1024 restores the compressed pattern data into geometry data.
(3) A geometry decomposition unit 1025 decomposes each of the restored geometries into shots, i.e., shapes capable of being drawn by the electron beam, and generates data about positions, shapes and exposure doses of the shots.
(4) An alignment correction unit 1026 employs a sensor 1009 to monitor any misalignment or relative deformation between the electron beam-irradiated position and the specimen 1008, and performs correction to compensate for the detected misalignment or deformation.
(5) A proximity effect correction unit 1027 corrects the proximity effect by obtaining in advance an exposure dose map 1029 (denoting unit area values of the patterns to be drawn) and storing the map into memory. The unit then corrects the dose of exposure for each shot while referring to values of the stored map.
(6) A follow-up absolute calibration unit 1028 computes a deflected position of the electron beam and corrects deflection-induced deformation of the electron beam body tube 1000. The computations and corrections ate performed in such a manner that the electron beam 1004 is irradiated onto a target position on the specimen 1008 in accordance with that position of the specimen table 1001 which is measured by a length measuring device 1010 and a specimen table position measuring unit 1020.
(7) A procedure control unit 1022 performs monitoring and controlling steps to make sure that the above-described units function smoothly.

Data from any of the units in the frame 1011 are converted from digital to analog format by a D/A converter 1013. The converted data are sent to a beam control unit 1014 that controls the lenses 1006 and deflector 1007. A high-voltage power supply 1015 generates an acceleration voltage of the electron gun 1003. An aperture control unit 1016 selects the shape of the aperture 1005 by controlling an aperture switching unit 1031. A specimen table control unit 1017 controls movement of the specimen table 1001. A transport control unit 1018 controls the transport unit 1002 transporting the specimen 1008 onto the specimen table 1001. These units are interconnected by the bus 1019 serving as the data line, and signals are transferred from one unit to another through appropriate interfaces. The computer 1012 may optionally control all these units.

Figure 2A:
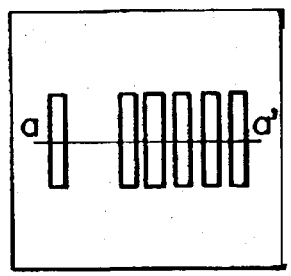
FIGS. 2A through 2J are graphic-representations of typical drawing patterns and energy doses of exposures performed by use of a charged particle beam.
Figure 2B:
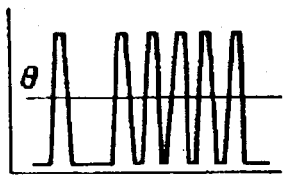
Figure 2E:
Figure 2H:
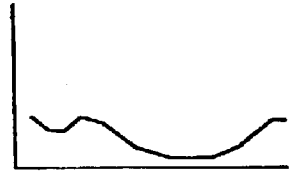

How the exposure area density method works will now be described by referring to FIGS. 2A through 2J. FIGS. 2A through 2J are graphic representations of typical drawing patterns and energy doses of exposures performed by use of a charged particle beam. FIG. 2A shows typical geometry patterns to be drawn, and FIGS. 2D and 2G illustrate examples of actually drawn patterns. FIGS. 2B, 2C, 2E, 2F, 2H, 2I and 2J graphically depict energy doses of exposures carried out using a charged particle beam. It is assumed that, as shown in FIG. 2A, a fine, longitudinal geometry is located on the left while five pieces of the same geometry are arranged at narrow intervals from the center to the right. Doses of exposure by the charged particle beam during drawing are represented by a cross-section taken on line a–a' in FIG. 2A. If there were no reexposure due to backward scattering from inside the substrate, there would be a uniform, ideal exposure allowing merely for a fuzzy contour of the particle beam spot, as shown in FIG. 2B. In that case, if the exposed patterns were developed at a cumulative energy level $\theta$, the geometries should be formed exactly as desired.

Figure 2C:
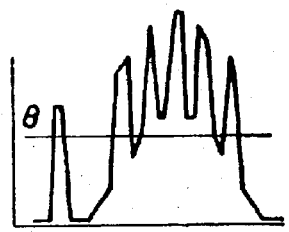

In reality, the reexposure caused by backward scattering from inside the substrate tends to bring about overexposure where the exposure area density is high as shown in FIG. 2C (to be discussed later). If the overexposed patterns are developed at the cumulative energy level $\theta$, the resulting geometries can be so fuzzy that they will no longer serve the purpose, as depicted in FIG. 2D. The phenomenon is called the proximity effect.

The proximity effect is corrected by the exposure area density method as follows: the drawing area is first divided into smaller regions. The exposure area densities of the smaller regions are computed and smoothed out. The smoothing is carried out to minimize any difference in exposure area density between adjacent smaller regions having a maximum and a minimum exposure area density. The smoothing process yields a waveform representing approximate exposure area densities as shown in FIG. 2E. Then the dose of exposure is reduced at peaks of the exposure area density waveform and is increased at troughs of the waveform. This provides another waveform illustrated in FIG. 2F. With this waveform in effect, developing the patterns at the cumulative energy level $\theta$ forms geometry patterns of more or less accurate line widths, as depicted in FIG. 2G.

The exposure area density method has a distinctive problem. As described, the optimum exposure dose per drawing geometry varies significantly with location-dependent changes of the exposure area density. In the case of an increase in size of a drawing geometry capable of being exposed in a single pass of charged particle beam irradiation, the geometry can then take on a size different from the desired geometry size at locations where the exposure area density changes abruptly.

The problem has been remedied conventionally as follows: by referencing the exposure area density waveform of FIG. 2E, supplementary exposure is performed prior to the exposure of the geometry patterns shown in FIG. 2A. That supplementary exposure is effected in large doses on smaller regions where the exposure area density is low, and in small doses on smaller regions where the exposure area density is high. More specifically, the supplementary exposure is carried out in doses represented by a waveform of FIG. 2H, before the exposure in doses denoted by the waveform of FIG. 2B. The resulting cumulative energy levels constitute a waveform of FIG. 2I. This supplementary exposure method involves effecting supplementary exposure based on inverted patterns of the drawing patterns represented by their exposure doses. As a result, a pattern requiring illustratively an exposure dose of the leftmost pattern in FIG. 2B actually receives a dose as small as that of the leftmost pattern in FIG. 2C, the actual dose being equivalent to that of the leftmost pattern in FIG. 2I. This leads to a possibility that necessary line widths will not be available, as with the leftmost pattern in FIG. 2D.

Figure 2F:
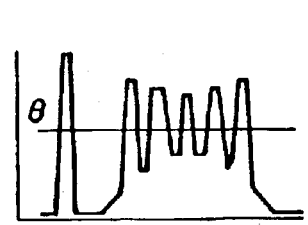
Figure 2I:
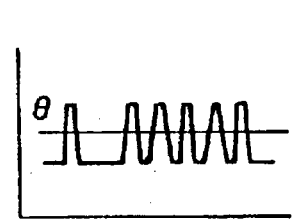
Figure 2D:
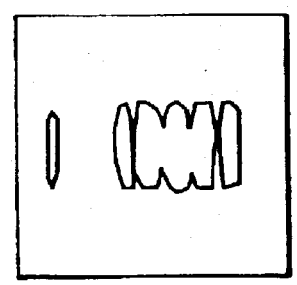
Figure 2G:
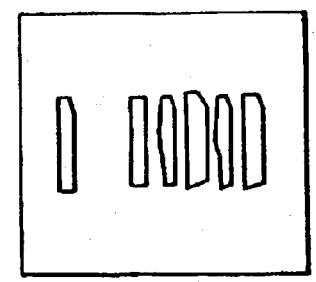
Figure 2J:
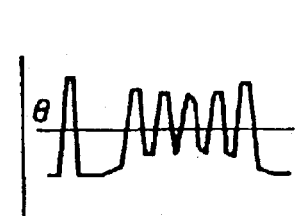

To avert the problem above, this invention envisages combining in suitable proportions the exposure area density method typified by FIGS. 2E and 2F with the supplementary exposure method of FIG. 2H. The combination scheme provides cumulative energy levels represented by a waveform of FIG. 2J and reduces changes in optimum exposure dose inside drawing geometries, thereby minimizing pattern size variations. At the same time, it is possible to ensure a sufficient dosage of exposure for the leftmost pattern in FIG. 2A.

The specifics of the invention will now be described in more detail. As discussed with reference to FIGS. 2A through 2J, an objective of the invention is to draw patterns of high and low densities at the same cumulative energy level θ. The objective is attained by determining pattern exposure doses such that the median of cumulative energy levels at the fluctuating pattern densities will still remain constant.

FIG. 3 is a cross-sectional view of a specimen 1008 under irradiation by an electron beam 1004 used as the charged particle beam. It is assumed that the electron beam 1004 is irradiated onto a photosensitive surface of the specimen 1008. In FIG. 3, reference character I stands for an irradiation dose of the charge particle beam, E1 for a cumulative energy level of charged particle beam irradiation onto the photosensitive surface, and E2 for a cumulative energy level of backward-scattered particles returning from the specimen 1008 onto the photosensitive surface. Reference character η denotes the ratio of the cumulative energy levels E1 and E2 to the same charged particle beam irradiation energy I.

If individual patterns to be exposed are infinitesimal and their exposure area density occurs as a constant value p, then the level of cumulative energy from backward scattering is given as p×E2 on average. It follows that a cumulative energy level U1 of exposed patterns and a cumulative energy level U2 of unexposed patterns are defined by the following expressions:

$$U1 = E1 + p \times E2 = (1 + p \times \eta) \times E1 \tag{1}$$

$$U2 = p \times E2 = p \times \eta \times E1 \tag{2}$$

Supplementary exposure, when carried out, provides a weak dose of exposure all over the drawing area. If the level of cumulative energy from the incident particle beam for supplementary exposure is denoted by E3, the above cumulative energy levels are defined as follows:

$$U1 = (1 + p \times \eta) \times E1 + (1 + \eta) \times E3 \tag{3}$$

$$U2 p \times \eta \times E1 + (1 + \eta) \times E3 \tag{4}$$

For the actual formation of patterns, the median of the cumulative energy level U1 for exposed patterns and the cumulative energy level U2 for unexposed patterns need only match the cumulative energy level θ. Thus a drawing irradiation dose I1 and a supplementary exposure irradiation dose I2 need only be determined in such a manner as to satisfy the following expression:

$$2\theta = U1 + U2 \tag{5}$$
$$= (1 + 2 \times p \times \eta) \times E1 + 2 \times (1 \times \eta) \times E3$$

To obtain irradiation doses satisfying the above relations involves first determining a suitable combination of E1 and E3 satisfying expression (5), as follows:

$$E1 = 2 \times \theta / [1 + 2 \times \eta \times \{(1-\alpha) \times p + \alpha\}] \tag{6}$$

$$E3 = 2 \times \theta \times \{\eta/(1+\eta)\} \times \alpha \times (1-p) / [1 + 2 \times \eta \times \{(1-\alpha) \times p + \alpha\}] \tag{7}$$

where, α denotes a positive number smaller than 1, a new parameter that determines the proportion of supplementary exposure. Because the drawing irradiation dose I1 and supplementary exposure irradiation dose I2 are proportional to the cumulative energy levels E1 and E3 respectively, expressions (6) and (7) above may be rewritten into expressions defining the drawing irradiation dose I1 and supplementary exposure irradiation dose I2 as follows:

$$I1 = I0 / [1 + 2 \times \eta \times \{(1-\alpha) \times p + \alpha\}] \tag{8}$$

$$I2 = \{\eta/(1+\eta)\} \times I0 \times \alpha \times (1-p) / [1 + 2 \times \eta \times \{1-\alpha) \times p + \alpha\}] \tag{9}$$

where, I1 stands for the drawing irradiation dose with respect to a drawing pattern portion, I2 for a supplementary exposure irradiation dose, and I0 for a charged particle beam irradiation dose for optimum exposure of a portion having an exposure area density of 0% without supplementary exposure.

With the expressions above in effect, carrying out drawing when α=0 is equivalent to implementing an exposure area density method without supplementary exposure; drawing performed when α=1 constitutes a supplementary exposure method; and drawing carried out when 0<α<1 represents a scheme combining the two methods of irradiation. Expressions (8) and (9) denote a typical combination of the methods whereby the earlier expression (5) is satisfied. Alternatively, the proportions of the exposure area density method and supplementary exposure method may be altered as desired using different selective procedures.

Whereas the exposure area density p is assumed to be a position-independent constant value herein for purpose of simplification, the density generally proves to be a function that varies with the position of the drawing pattern. When the exposure area density p is dependent on the pattern position, it is necessary to smooth out in advance p values within a range affected by backward scattering so that the p values will reflect the influence of backward scattering. Since the smoothed exposure area density p is barely affected by fine spatial changes, some spatial changes in the exposure area density p still leave the above expressions of irradiation doses utilized in an approximate manner. On the other hand, it is also possible to put into a more detailed model the phenomena observed when the exposure area density p is varied so that the irradiation doses will be computed more accurately by use of the exposure area densities of proximate smaller regions.

Described so far is a way to correct the proximity effect based on drawing pattern densities. Alternatively, it is possible to extend the inventive method so that not only the influence of the density of patterns being drawn will be corrected as described, but also the effects of the density of already drawn underlayer patterns will be rectified. Below is a description of how to correct the proximity effect with the influence of underlayer patterns taken into consideration.

If the patterns to be drawn are circuit patterns of a semiconductor wafer, it may happen that a substrate on which to draw the patterns have underlayer patterns already formed thereon, with materials of different properties deposited as per the patterns. In such a case, the proportion $\eta$ of the cumulative energy level denoting the rate of backward scattering varies considerably between a region having underlayer patterns and a region with no underlayer patterns. That is, the above-described correction method is incapable of properly correcting all regions because it works on the assumption that the proportion $\eta$ of the cumulative energy level is a position-independent constant value. This drawback is bypassed as follows:

The influence stemming from the presence or absence of underlayer patterns is reflected in the proportion $\eta$ of the cumulative energy level representing the above-mentioned rate of backward scattering. If it is assumed that $\eta 0$ stands for the rate $\eta$ of the cumulative energy level in effect when no underlayer patterns are present and that $\eta 1$ denotes the rate $\eta$ of the cumulative energy level in effect when underlayer patterns are present all over the surface, then the rate $\eta$ of the cumulative energy level where the area density of underlayer patterns is p1 is approximated through linear interpolation by the following expression:

$$\eta = \eta 0 + (\eta 1 - \eta 0) \times p1 \tag{10}$$

Inserting the above rate $\eta$ of the cumulative energy level into the earlier expressions (8) and (9) provides an optimum dose of charged particle beam irradiation for implementing the correction of the proximity effect with the influence of underlayer patterns taken into account. If $\alpha = 0$, then the correction constitutes an exposure area density method which deals with the proximity effect between two layers.

One way of correcting the proximity effect between two layers based on the exposure area density method is disclosed in U.S. Pat. No. 5,149,975 by the inventors of the present invention. This invention provides another way of correcting the proximity effect between two layers.

According to this invention, the novel method of correcting the proximity effect between two layers combines the supplementary exposure method with the exposure area density method. When $\alpha > 0$, the method causes exposure area densities p and p1 to be referenced for each of drawing geometries and supplementary exposure geometries in the position of the geometry in question. Exposure is then carried out for an irradiation time corrected by the above expressions (8) and (9) into which $\eta$ of expression (10) is inserted. If supplementary exposure alone is to be performed, the proportions of drawing geometry exposure and supplementary exposure are altered so that the expressions (8) and (9) will be redefined as shown below, where $\eta 1 > \eta 0$.

$$I1 = I0/[1 + 2 \times \eta 1] \tag{11}$$

$$I2 = I0 \times (\eta 1 - \eta \times p)/\{(1+\eta) \times (1 + 2 \times \eta 1)\} \tag{12}$$

This keeps constant the exposure time for the drawing geometries. That is, supplementary exposure alone can achieve the correction of the proximity effect between two layers. In any case, it is also necessary that the exposure area density p1 of underlayer patterns be smoothed spatially in advance within a suitable range of backward scattering.

As a practical method for correction, the rate $\eta$ of the cumulative energy level in expression (10) may be inserted into expressions (8) and (9) to rearrange them into the following expressions in which pseudo exposure area densities p2 and p3 are computed in such a way that the expressions will hold:

$$I1 = I0/[1 + 2 \times \eta 1 \times p2] \tag{13}$$

$$I2 = \{\eta 1/(1+\eta 1)\} \times I0 \times \alpha \times (1 \times p3) \tag{14}$$

When the above computations are performed beforehand, either of the pseudo exposure area densities p2 and p3 serves as the position-dependent variable in each of the two expressions. Then at an actual exposure time, the pseudo exposure area density p2 or p3 is read out with respect to the position of each of the drawing geometries and supplementary exposure geometries. The read-out area density for each geometry is converted to a specific dose of charged particle beam irradiation on a one-to-one basis. This feature helps simplify the circuit constitution.

A specific embodiment of the proximity effect correction method discussed above will be explained below. FIG. 1 is a block diagram showing major components of the variable shaped charged particle beam drawing apparatus described with reference to FIG. 10. Drawing pattern data 3 input from an auxiliary storage 2 of a controlling computer 1 are placed temporarily into a high-speed buffer memory 4 before being read out rapidly at the time of drawing. Generally, the retrieved drawing pattern data 3 have been compressed to a considerable extent. The compressed data are restored by a restoration circuit 5 into data representing individual basic geometries. The basic geometries are decomposed by a geometry decomposition circuit 6 into data groups denoting rectangles each small enough to be exposed entirely in a single pass of exposure. Outputs from the geometry decomposition circuit 6 are made up of charged particle beam irradiation times T, rectangle dimensions (width and height), and position coordinates (X, Y). On a conventional variable shaped beam drawing apparatus with no function for proximity effect correction, the irradiation time T is input to an irradiation time generation circuit 7 for conversion to an irradiation on/off timing signal S2 about the charged particle beam. The rectangle dimensions (W, H) are input to a D/A converter 8 for conversion to an analog signal S3 for forming a charged particle beam cross-section. The position coordinates (X, Y) are input to another D/A converter 8 for conversion to an analog signal S4 for position deflection. These signals are used to control the charged particle beam apparatus body tube 10.

Every time a rectangular geometry is exposed, the drawing control circuit of the variable shaped charged particle beam drawing apparatus in FIG. 1 outputs control data representing the position (X, Y), dimensions (W, H), and charged particle beam irradiation time T regarding the geometry in question. According to the conventional exposure area density method for proximity effect correction, as disclosed in the above-cited Japanese patent Laid-open No. Hei 3-225816, a proximity effect correction circuit 13 is additionally installed downstream of the geometry decomposition circuit 6 in FIG. 1. The added circuit handles exposure dose computations for each smaller region as well as irradiation time changes per drawing geometry. What the proximity effect correction circuit 13 does will be described below in detail to clear the way for a further explanation of the specifics of this invention.

Figure 5A:
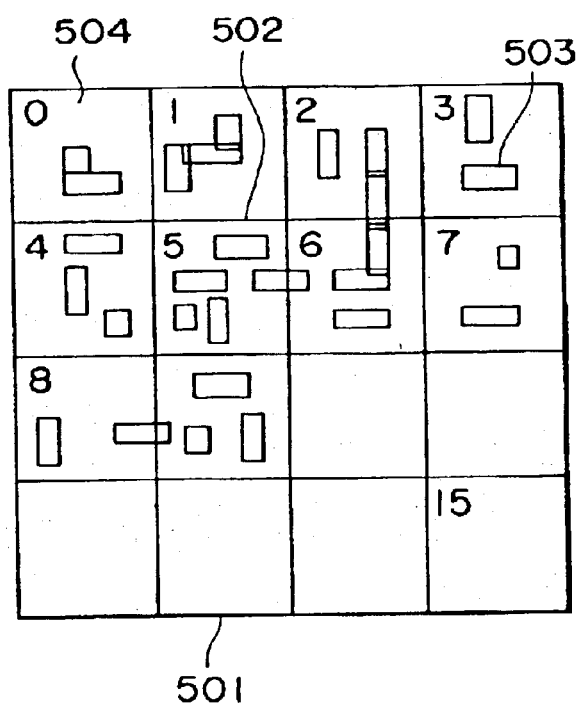
FIGS. 5A and 5B are explanatory views of drawing geometries on a specimen surface and of typical exposure area densities held in a storage circuit.
Figure 5B:
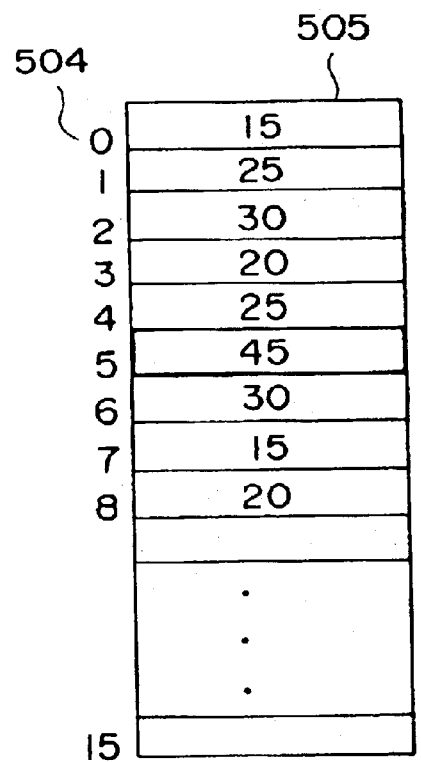

FIG. 4 is a function block diagram of the proximity effect correction circuit 13 shown in FIG. 1, and FIGS. 5A and 5B are explanatory views of drawing geometries on a specimen surface and of typical exposure area densities held in a storage circuit.

In FIG. 5A, the surface of a specimen 501 is divided illustratively into 15 smaller regions 502 as shown. Each smaller region 502 contains differently shaped drawing geometries 503. Each smaller region 502 is given a smaller region number 504. As shown in FIG. 5B, a storage circuit 23 in FIG. 4 has its memory accommodating the smaller region numbers 504.

For purpose of simplification and illustration, it is assumed that the position coordinates X and Y of the rectangular geometries take on values 0 through 1023, where X and Y denote 12-bit data each.

The high-order four bits of Y and the high-order four bits of X are appropriated respectively as high-order four bits and low-order four bits constituting an eight-bit number S11. This number S11 is input via a selection circuit 22 in FIG. 4 to a memory area representing addresses of the storage circuit 23. A smaller region wherein Y ranges from 0 to 63 and X from 0 to 63 corresponds to address 0 in the storage circuit 23; a smaller region wherein Y ranges from 0 to 63 and X from 64 to 128 corresponds to address 1 in the storage circuit 23; and so on. Each of the 64×64 divided smaller regions corresponds to a single address in the storage circuit 23. As shown in FIGS. 5A and 5B, the number of each address denotes a smaller region number 504. Prior to exposure, all smaller regions in the storage circuit 23 are assumed to be filled with zeros.

For each rectangular drawing geometry to be exposed, its X and Y coordinates are used to determine an address in the storage circuit 23, and W×H values S12 computed by a multiplier 24 are added by an adder 26 to the contents S16 read from that address in the storage circuit 23. The sum is written back to the storage circuit 23 by a selection circuit 28. That is, as shown in FIG. 5B, exposure area density data on each smaller region 504 are retained in a memory 505. When exposure has been completed using all exposure data, the storage circuit 23 retains a total sum of the geometry areas of each smaller region.

Strictly speaking, the above method will not give an exact total sum of the geometry areas because data representing a single rectangle may span a plurality of smaller regions. Still, since the dimensions of each rectangle to be exposed are sufficiently small compared with the size of each smaller region, any difference between the actual and the computed total sum of the geometry areas is negligible.

Now the exposure areas of the smaller regions have been stored in the storage circuit 23. To be done next is for the area value of each smaller region to be smoothed out using values of the proximate smaller regions surrounding the smaller region in question, whereby a widespread distribution of exposure does is calculated. One specific way of doing this is by replacing the value of each small region with a weighted sum of the values of 5×5 smaller regions surrounding the small region in question. In that case, the smaller regions not overlapping the pattern regions are assumed to have zero exposure with regard to computing.

The intensity of backward scattering may be approximated by Gaussian weighted smoothing. Where smoothing is required for an area wider than 5×5 smaller regions because of an extensive range of the proximity effect, the smoothing covering the 5×5 smaller regions is repeated a number of times over the extensive area in order to find the intensity of backward scattering. The smoothing computations involve simply retrieving contents of the storage circuit 23, obtaining a weighted sum of the appropriate values, and writing the result back to the circuit. The computations are adequately carried out by simply adding a computation circuit 29 to the storage circuit 23, as depicted in FIG. 4. In that setup, an address signal S13 corresponding to a desired smaller region is sent from the computation circuit 29 to the storage circuit 23 via the selection circuit 22. In turn, the storage circuit 23 gives an output S16 which is used for the smoothing computations. The result of the computations is written back to the storage circuit 23 via the selection circuit 28.

Alternatively, the dedicated computation circuit may be eliminated. Instead, contents of the storage circuit may be read into the controlling computer of the drawing apparatus. After computations, the result from the computer may be written back to the storage circuit.

Figure 6:
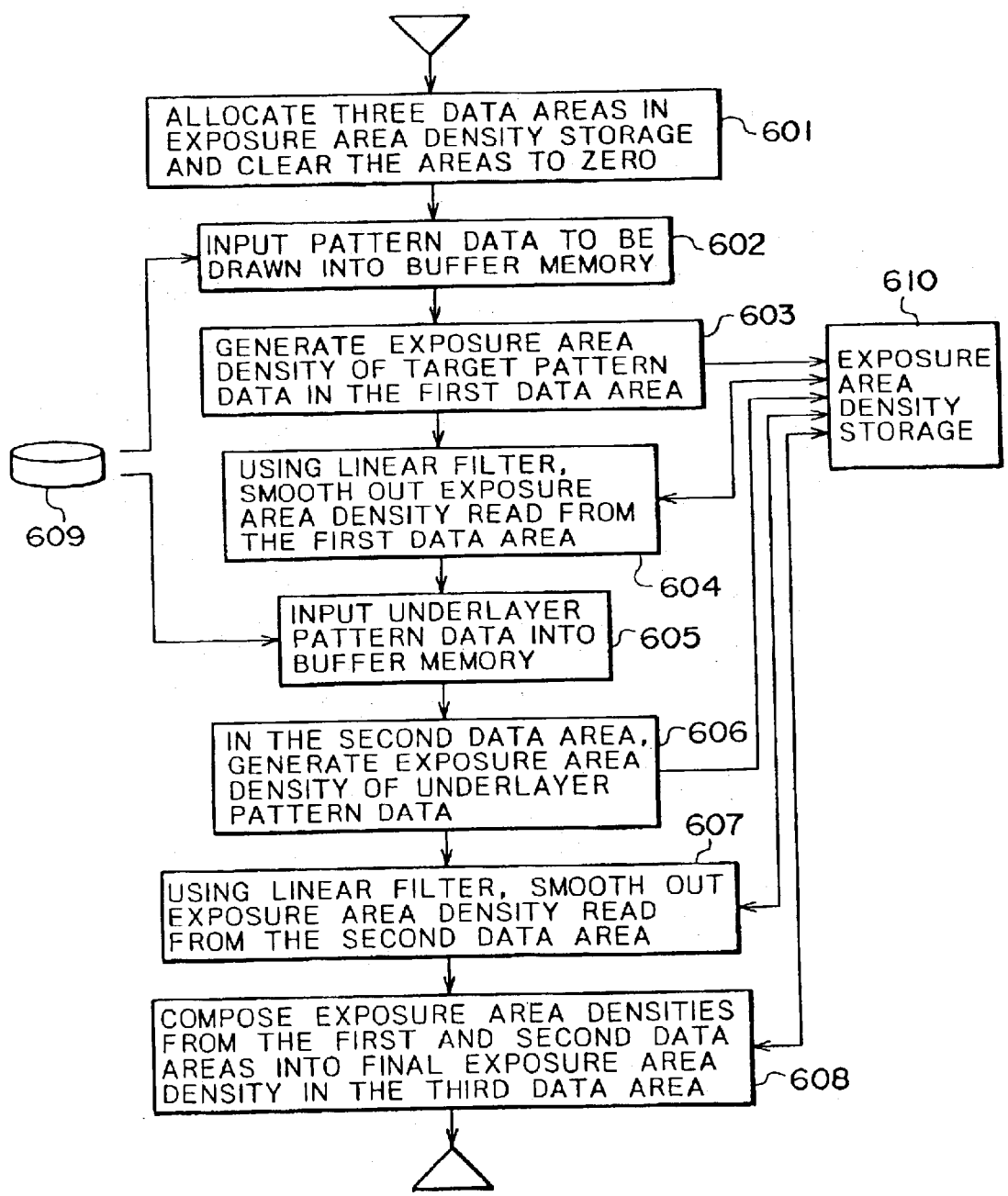
FIG. 6 is a flowchart of steps constituting a procedure for generating exposure area densities where underlayer patterns of the specimen have the proximity effect.

If underlayer patterns of the specimen have the proximity effect, then underlayer pattern data may be input so as to generate exposure area densities of the underlayer patterns by means of a procedure like the one discussed above. FIG. 6 is a flowchart of steps constituting a typical procedure for generating exposure area densities in effect when underlayer patterns of the specimen have the proximity effect.

In step 601, three data areas are allocated in a exposure area density storage and are cleared to zero. In step 602, data about patterns to be drawn are read from a drawing pattern data file 609 and input to a buffer memory. In step 603, an exposure area density of the target pattern data is generated in the first data area, one of the three data areas in the exposure area density storage device 610. In step 604, the exposure area density is retrieved from the first data area in the exposure area density storage device 610 and, by use of a linear filter, corrected and smoothed so as to minimize differences in area density between adjacent smaller regions. In step 605, underlayer pattern data are read from the drawing pattern data file 609 and input to the buffer memory. In step 606, an exposure area density regarding the underlayer pattern data is generated in the second data area. In step 607, the exposure area density from the second data area is smoothed out by use of the linear filter. In step 608, the exposure area densities from the first and second data areas are composed into a final exposure area density that is set to the third data area. The steps above generate the exposure area density through data correction between two layers.

Upon actual drawing, the position coordinates of data about a rectangle are furnished, and the corrected exposure dose is read accordingly from the storage circuit 23 in FIG. 4 with respect to the smaller region in question. The signal S16 from the storage circuit 23 is then converted by a conversion circuit 32a into a correction coefficient. After the conversion, the correction coefficient is input as an output signal S17 of a selection circuit 34 to a multiplier 33. The multiplier 33 multiplies the received correction coefficient S17 by the irradiation time T, information attached to the rectangle data in question, to generate new irradiation time data T'. Although this embodiment utilizes the multiplier 33 for irradiation time conversion, this is not limitative of the invention. Where a default value of irradiation time is already known, the conversion may be carried out through additions and subtractions and the result is still the same. The conversion circuit 32a may be implemented alternatively as a read-only storage circuit accommodating previously computed suitable values. As another alternative, the conversion circuit 32 may be implemented as a storage circuit to which converted values are written from the outside as needed, and contents of that conversion circuit may be retrieved using the output signal S16 of the storage circuit 23 as an address. That conversion circuit 32a may be arranged so that a small correction coefficient is output where the exposure dose is high and a large correction coefficient is output where the exposure dose is low. The arrangement permits automatic exposure for a reduced irradiation time over patterns for which the pattern density is high and so is the exposure dose, whereby the influence of the proximity effect is alleviated considerably.

Figure 7:
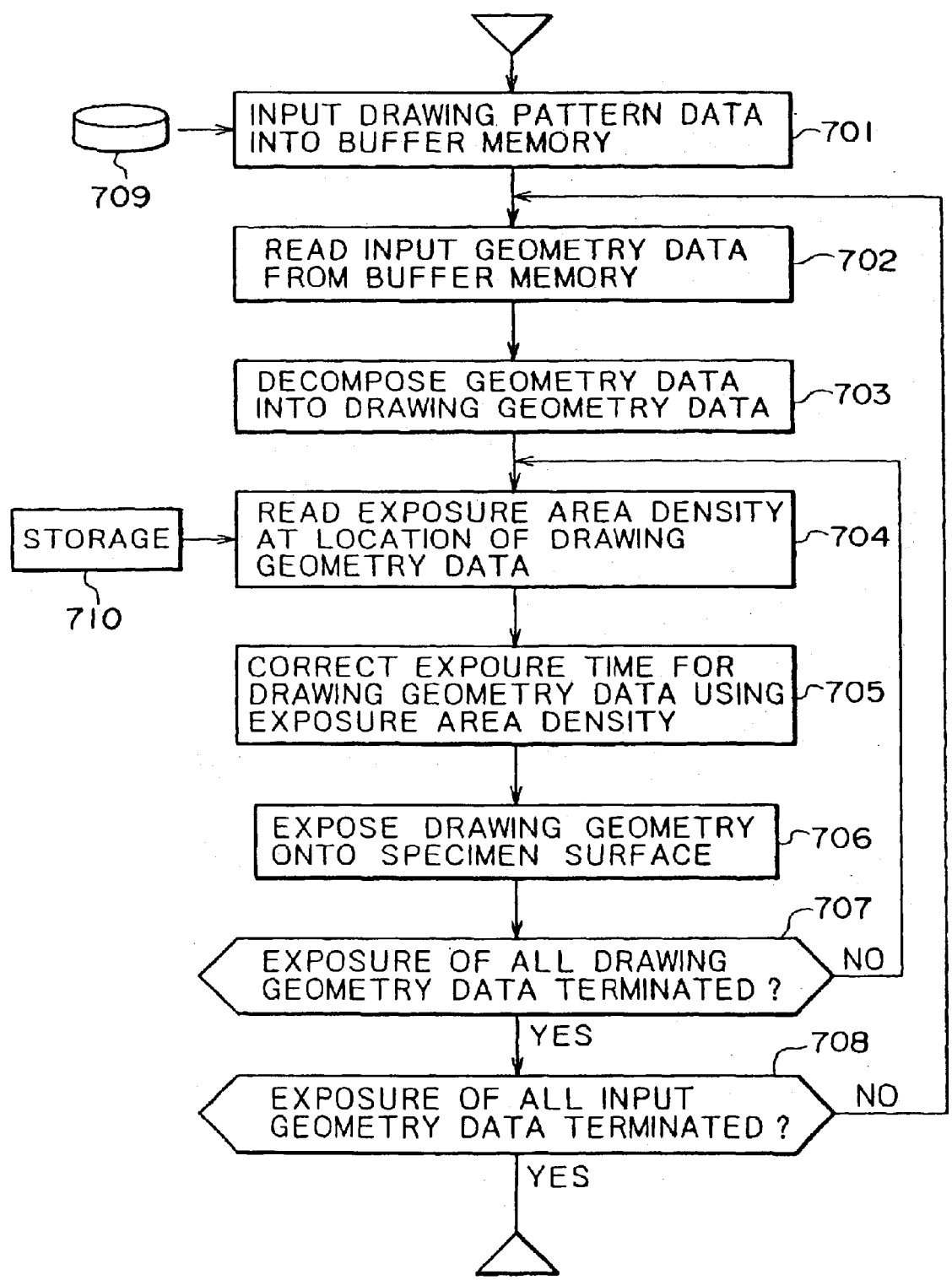
FIG. 7 is a flowchart of steps constituting a procedure for exposure of drawing pattern data.

FIG. 7 is a flowchart of steps constituting a procedure for exposure of drawing pattern data. In step 701, drawing pattern data are read from a drawing pattern data file 709 and input to a buffer memory. In step 702, the input geometry data are read from the buffer memory. In step 703, the geometry data are decomposed into drawing geometry data. In step 704, the exposure area density at a location of drawing geometry data is read from a storage device 710. In step 705, the exposure time for the drawing geometry data is corrected by use of the exposure area density. In step 706, the drawing geometry is exposed onto the specimen surface. In step 707, a check is made to see if exposure of all drawing geometry data has been terminated. If the exposure has yet to be terminated, step 704 is reached again. If the exposure of all drawing geometry data is found to be terminated, step 708 is reached. In step 708, a check is made to see if exposure of all input geometry data has been terminated. If the exposure has yet to be terminated, step 702 is reached again; if the exposure is judged to be completed, the exposure process is terminated.

The exposure dose for the position of each drawing geometry may be acquired more accurately by considering the value of each smaller region to be that of the central position of that region, with the exposure dose S16 (see FIG. 4) for each geometry position being obtained through linear interpolation based on the exposure doses of proximate smaller regions surrounding the region in question. This procedure makes it possible to correct the proximity effect more accurately. Implementation of the procedure is a little more complex than that of the above-described embodiment but may be readily carried out by those skilled in the art.

The proximity effect correction circuit 13 in FIG. 1 was described in detail with reference to FIG. 4. Other components included in FIG. 1 will now be explained below.

The pattern in FIG. 2H for supplementary exposure according to the invention represents a whole drawing area. Usually, the supplementary exposure pattern is a single, large rectangular pattern within a range where the charged particle beam can deflect. Obviously, the pattern may also be a group of small rectangular patterns covering the entire drawing area depending on the drawing control procedure in use. Data on the supplementary exposure pattern are input by a selection circuit 12 into the geometry decomposition circuit 6 for decomposition into supplementary exposure geometries each capable of being wholly exposed in a single pass of charged particle beam irradiation.

For each of the decomposed supplementary exposure geometries, the exposure area density p corresponding to the position of the geometry in question is read from the storage circuit 23, as discussed above in conjunction with FIG. 4. The read-out exposure area density p is converted to a correction coefficient by a conversion circuit 32b that is distinct from its counterpart used in connection with drawing geometries. The correction coefficient is input to the multiplier 33 which in turn corrects a predetermined irradiation time T for drawing. The irradiation time T is usually a constant value independent of supplementary exposure geometries.

Figure 8:
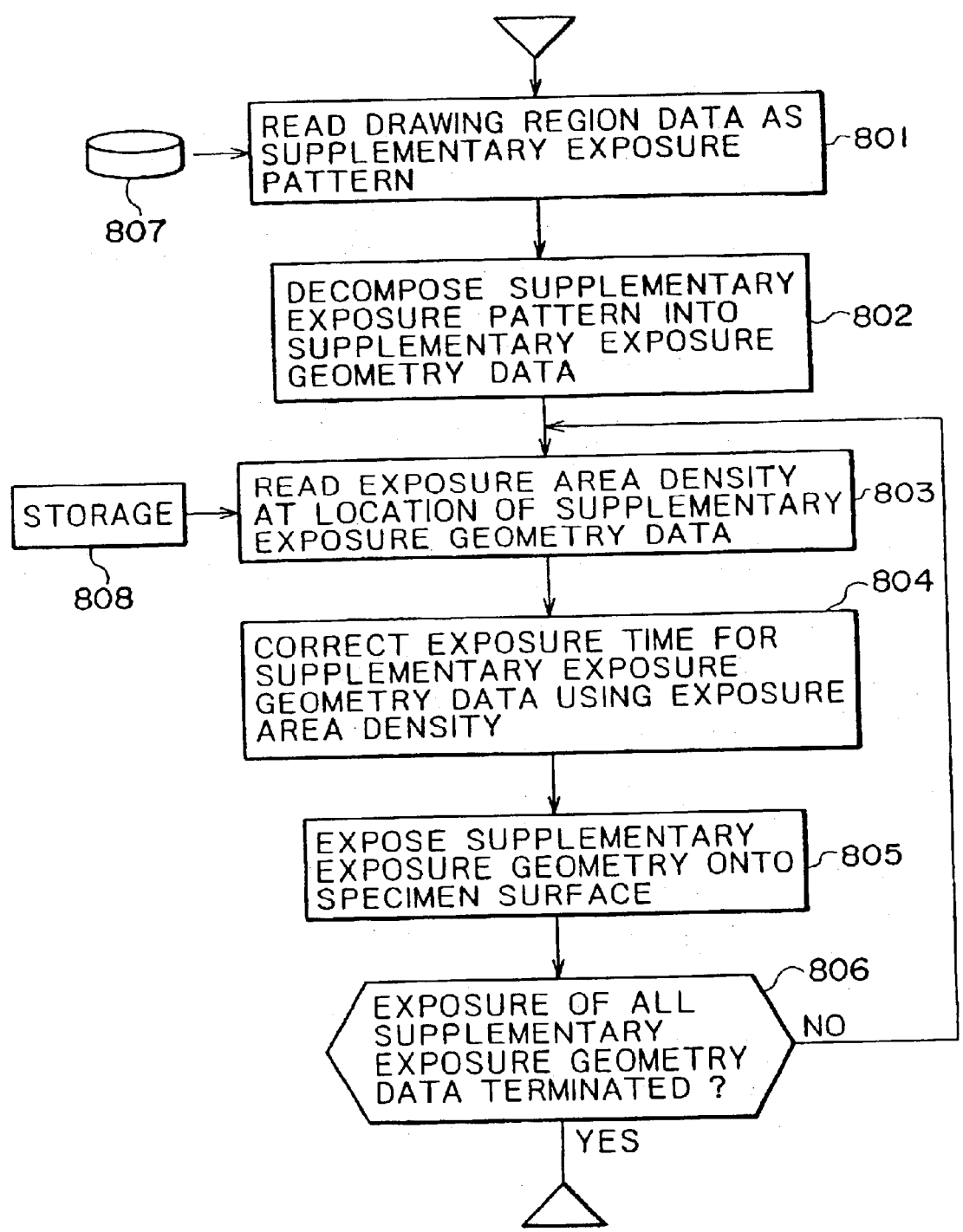
FIG. 8 is a flowchart of steps constituting a procedure for supplementary exposure.

FIG. 8 is a flowchart of steps constituting a typical procedure for supplementary exposure. In step 801, drawing region data are read from a drawing region data file 807 as a supplementary exposure pattern. In step 802, the supplementary exposure pattern is decomposed into supplementary exposure geometry data. In step 803, the exposure area density at a location of supplementary exposure geometry data is read from a storage device 808. In step 804, the exposure time for the supplementary exposure geometry data is corrected by use of the exposure area density. In step 805, the supplementary exposure geometry is exposed onto the specimen surface. In step 806, a check is made to see if exposure of all supplementary exposure geometry data has been terminated. If the exposure has yet to be terminated, step 803 is reached again; if the exposure is judged to be completed, the exposure procedure is terminated.

Conversion by use of the conversion circuits 32a and 32b in FIG. 4 should be performed pursuant to expression (8) for the exposure of a drawing geometry and to expression (9) for the exposure of a supplementary exposure geometry. For these expressions, it is assumed that p denotes the exposure area density retrieved from the storage circuit, that I0 represents a previously furnished exposure dose, and that η and α are constants. The conversion is thus readily carried out when supplementary data dependent on exposure area densities p are computed and stored beforehand in a data table so that an appropriate value is read from the data table in accordance with a given exposure area density p.

The conversion circuits 32a and 32b in FIG. 4 are used respectively for corrections involving drawing geometry exposure and supplementary exposure. When α=1, the processing accomplished by the setup is equivalent to a supplementary exposure method. In such a case, the pattern data for supplementary exposure need only be constituted by a small number of rectangular patterns with a fixed exposure time. This provides the benefit of a very limited amount of data to be furnished from the outside for supplementary exposure.

Described below is how to find exposure area densities through correction between two layers in conjunction with supplementary exposure. In the case of proximity effect corrections with the influence of an underlayer pattern taken into consideration, the exposure area densities p and p1 for a drawing pattern and for the underlayer pattern are obtained in advance. On the basis of the acquired exposure area densities p and p1, the computation circuit 29 in FIG. 4 computes pseudo exposure area densities p2 and p3 such as to satisfy expressions (13) and (14) above. Upon exposure of a drawing geometry, the pseudo exposure area density p2 corresponding to the location of that geometry is read out. Given the pseudo exposure area density p2, the conversion circuit 32a and multiplier 33 obtain the dose of charged particle beam irradiation through the use of expression (13) for irradiation time correction. Upon exposure of a supplementary exposure geometry, the pseudo exposure area density p3 corresponding to the location of that geometry is retrieved. Given the pseudo exposure area density p3, the conversion circuit 32b and multiplier 33 acquire the dose of charged particle beam irradiation through the use of expression (14) for irradiation time correction.

It is possible to omit the process of conversion into the pseudo exposure area densities p2 and p3 and to retrieve the exposure area densities p and p1 corresponding to a given geometry in each pass of exposure so as to perform the conversions of expressions (11) and (12). This, however, entails enlarging the scale of computation circuitry. It is more advantageous to compute the pseudo exposure area densities p2 and p3 beforehand.

Figure 9:
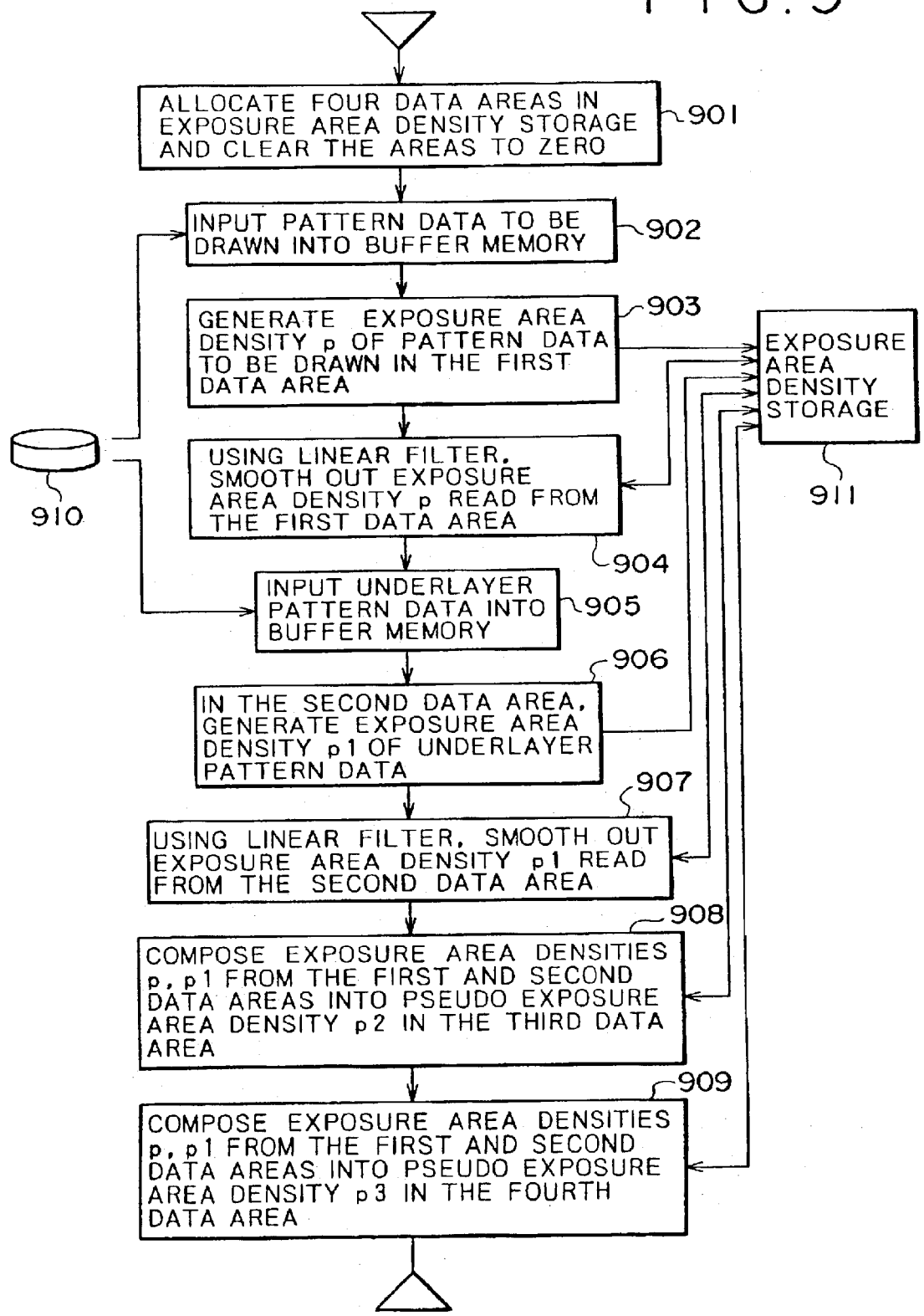
FIG. 9 is a flowchart of steps constituting a procedure for generating exposure area densities through correction between two layers with the aid of supplementary exposure.

FIG. 9 is a flowchart of steps constituting a typical procedure for generating exposure area densities through correction between two layers in conjunction with supplementary exposure. In step 901, four data areas are allocated in an exposure area density storage device and are cleared to zero. In step 902, pattern data to be drawn are retrieved from a drawing pattern data file 910 and input to a buffer memory. In step 903, the exposure area density p of the target pattern data is generated in the first data area, one of the four data areas allocated in the exposure area density storage device 911. In step 904, the exposure area density p is read from the first data area in the exposure area density storage device 911 and, by use of a linear filter, subjected to a smoothing process for minimizing any difference in area density between adjacent smaller regions. In step 905, underlayer pattern data are read from the drawing pattern data file 910 and input to the buffer memory. In step 906, the exposure area density p1 of the underlayer pattern data is generated in the second data area. In step 907, the exposure area density p1 from the second data area is smoothed out by use of the linear filter. In step 908, the exposure area densities p and p1 from the first and second data areas are composed into a pseudo exposure area density p2 that is set to the third data area. In step 909, the exposure area densities p and p1 from the first and second data areas are composed into a pseudo exposure area density p3 that is set to the fourth data area. The steps above are thus carried out to generate the exposure area densities.

When exposure of supplementary exposure geometries is carried out over the entire drawing regions on the specimen surface followed by exposure of drawing geometries, it takes two rounds of alignment to complete the exposure of each region. If each region is subjected consecutively to the exposure of a supplementary exposure geometry and that of a drawing geometry before the specimen is moved to the next region for another round of exposures, it will take only one round of alignment to complete the exposure of each region. This saves a significant amount of time in aligning.

On conventional charged particle beam drawing apparatuses, it takes time to switch from the means for irradiating a defocused charged particle beam for supplementary exposure to the means for drawing, or vice versa, because of the preparations involved for the different types of exposure. By contrast, the inventive supplementary exposure method causes a controlling computer to issue control signals to switch quickly between supplementary exposure and drawing geometry exposure.

As one embodiment of this invention, the above-described variable shaped charged particle beam drawing apparatus was shown employing a charged particle beam having a rectangular section. However, this is not limitative of the invention. Alternatively, the charged particle beam may have any of such sections as a triangle and an L-shape. The drawing apparatus uses numeric signals for controlling the beam section. Internal computation circuits compute the cross-sectional area of the beam using the signals. This invention is practiced through the use of a charged particle beam having any section shape desired.

There exist drawing apparatuses whereby one of specific circuit patterns is selected as an aperture through which to form a variable shaped beam, the pattern being repeated to achieve the drawing. When this invention is applied to that type of drawing apparatuses, the cross-sectional area of each of specific patterns, already known, may be regarded as a parameter. Exposure area densities corresponding to these parameters may then be added up in a cumulative manner.

With the embodiment of the invention described above, exposure area densities and pseudo exposure area densities are computed by a built-in computer of the drawing apparatus. Alternatively, these densities may be computed by a separate computing device beforehand and transmitted to the drawing apparatus prior to a drawing session.

Where the above embodiment of the invention is in use, a drawing geometry is exposed in a lump by a single irradiation pass of a charged particle beam transiting through the aperture of a specific shape. In that case, the aperture is allowed to be larger than the cross-sectional area of the charged particle beam so that the beam may be manipulated to scan the aperture for exposure.

The above-described constitution provides correction of the proximity effect in an easier and more accurate manner than before. This allows infinitesimal patterns to be formed by a charged particle beam.

The correction of the proximity effect according to the inventive supplementary exposure method does not require large quantities of supplementary exposure pattern data or exposure time data for supplementary exposure. Hence there is no need for a specialized equipment structure to defocus the charged particle beam for exposure. This contributes to reducing the drawing apparatus in size.

The inventive supplementary exposure method for correcting the proximity effect permits corrective processing between two layers with the influence of underlayer patterns that was difficult to carry out using conventional supplementary exposure methods taken into consideration. An underlayer of the substrate may include a wiring pattern of a heavy metal with a high reflectance regarding a charged particle beam. In such a case, conventional methods have found it difficult to form fine patterns simultaneously at all target locations because the exposure dose for correcting the proximity effect varies with the presence or absence of the wiring pattern. The concurrent formation of fine patterns over all locations has become possible with the supplementary exposure method of the invention. This feature proves to be particularly effective where infinitesimal circuit patterns are to be directly drawn on a semiconductor wafer by use of a charged particle beam.

The scheme of combining the exposure area density method with the supplementary exposure method according to the invention minimizes small divergences of line widths in exposure patterns. Where a simple, conventional exposure area density method was used to expose a large area in a single pass of charged particle beam irradiation, these divergences were left unmodified from one region to another having abruptly changing area densities. This means that, given the same level of line width accuracy, the inventive scheme is capable of drawing a larger geometry in a lump than before, whereby the drawing throughput is enhanced appreciably.

The inventive scheme thus permits more accurate drawing than conventional charged particle beam drawing methods. The semiconductor patterns drawn by the inventive method may be rendered more infinitesimal than ever before.

As described, the invention offers a charged particle beam drawing apparatus and a pattern forming method for minimizing the proximity effect in drawing fine patterns, thereby eliminating the traditionally experienced disadvantages of the conventional exposure area density method and supplementary exposure method.

As many apparently different embodiments of this invention may be made without departing from the spirit and scope thereof, it is to be understood that the invention is not limited to the specific embodiments thereof except as defined in the appended claims.

What is claimed is:

1. A pattern forming method for having a drawing pattern exposed to a drawing area on a specimen by irradiation with a charged particle beam, comprising:

performing a supplementary exposure by irradiating said drawing area on said specimen with said charged particle beam by:

dividing said drawing area into a plurality of smaller regions of an equal area each while calculating an area value of said drawing pattern in each smaller region;

correcting the area value of each smaller region by use of a weighted sum of the area values calculated for proximate smaller regions surrounding the smaller region in question;

generating supplementary exposure geometries in regard to said divided smaller regions; and computing doses of exposure for the generated supplementary exposure geometries by referring to the corrected area values; and performing a main exposure by irradiating, with said charged particle beam, a region constituted by said drawing pattern inside said drawing area on said specimen;

wherein pattern exposure doses of said irradiated charged particle beam in said step of performing supplementary exposure and main exposure are determined such that a median of cumulative energy levels at fluctuating pattern densities remains constant.

2. A pattern forming method according to claim 1, wherein said supplementary exposure step further comprises:

calculating an area value of an underlayer pattern formed for each smaller region on said specimen; and correcting the area value of said underlayer pattern for each smaller region by use of the area values of underlayer patterns calculated for said proximate smaller regions surrounding the smaller region in question; and wherein the step of computing the doses of exposure for the generated supplementary exposure geometries further comprises the step of computing a dose of exposure referring to the corrected area value of the smaller region in question as well as to the corrected area value of said underlayer pattern.

3. A pattern forming method according to claim 1, wherein said supplementary exposure step is carried out before said main exposure step.

4. A charged particle beam drawing apparatus for having a drawing pattern exposed to a drawing area on a specimen by irradiation with a charged particle beam, the apparatus comprising:

a charged particle beam exposing unit which performs supplementary exposure by irradiating said drawing area on said specimen with said charged particle beam, and which performs main exposure by irradiating with said charged particle beam a region constituted by said drawing pattern inside said drawing area on said specimen; and a computing device connected to said charged particle beam exposing unit by means of a data line, wherein said computing device divides said drawing area into a plurality of smaller regions of an equal area each; calculates an area value of said drawing pattern in each smaller region; corrects the area value of each smaller region by use of a weighted sum of the area values calculated for proximate smaller regions surrounding the smaller region in question, thereby computing a dose of main exposure for use by said charged particle beam exposing unit with regard to each smaller region of said specimen; generates supplementary exposure geometries in regard to said divided smaller regions; and computes doses of supplementary exposure for the generated supplementary exposure geometries by referring to the corrected area values; and wherein said computing device sends the computed doses of supplementary exposure and of main exposure to said charged particle beam exposing unit, wherein pattern exposure doses of said irradiated charged particle beam when said charged particle beam exposing unit performs supplementary exposure and main exposure are determined such that a median of cumulative energy levels at fluctuating pattern densities remains constant.

5. A charged particle beam drawing apparatus according to claim 4, further comprising a memory for storing the area values corrected by said computing device.

6. A charged particle beam drawing apparatus according to claim 4, wherein said charged particle beam exposing unit performs said supplementary exposure based on the doses of supplementary exposure computed by said computing device, before executing aid main exposure involving exposure of regions each smaller than an electrically deflectable spot formed by said charged particle beam.

7. A charged particle beam drawing apparatus according to claim 4, further comprising a specimen table which moves while carrying said specimen following said supplementary and said main exposure performed by said charged particle beam exposing unit.

8. A charged particle beam drawing apparatus according to claim 4, wherein said computing device calculates an area value of an underlayer pattern formed for each smaller region on said specimen; corrects the area value of said underlayer pattern for each smaller region by use of the area values of the underlayer patterns calculated for said proximate smaller regions surrounding the smaller region in question; and determines the dose of exposure or said supplementary exposure geometry by referring to the corrected area value of the smaller region in question as well as to the corrected area value of the corresponding underlayer pattern.

9. A charged particle beam drawing apparatus for having a drawing pattern exposed to a drawing area on a specimen by irradiation with a charged particle beam, the apparatus comprising:

a charged particle beam exposing unit which performs supplementary exposure by irradiating said drawing area on said specimen with said charged particle beam, and which performs main exposure by irradiating with said charged particle beam a region constituted by said drawing pattern inside said drawing area on said specimen;

a area computing unit which divides said drawing area into a plurality of smaller regions of an equal area each, and which calculates an area value of said drawing pattern in each smaller region;

an area correcting unit which corrects the calculated area value of each smaller region by use of a weighted sum of the area values calculated for proximate smaller regions surrounding the smaller region in question;

a memory which stores the corrected area values;

a main exposure dose computing unit which computes a dose of exposure for each smaller region based on the area values corrected by said area correcting unit;

a geometry generating unit which generates supplementary exposure geometries in regard to said divided smaller regions;

a supplementary exposure dose computing unit which refers to the corrected area values stores in said memory in order to expose said drawing area by doses of supplementary exposure using said supplementary exposure geometries generated by said geometry generating unit; and a data line which connects said main exposure dose computing unit and said supplementary exposure dose computing unit to said charged particle beam exposing unit, thereby allowing transmission of the doses of exposure and of supplementary exposure regarding each smaller region from the computing units to the exposing unit, wherein pattern exposure doses of said irradiated charged particle beam computed by said main exposure dose computing unit and said supplementary exposure dose computing unit are determined such that a median of cumulative energy levels at fluctuating pattern densities remains constant.

10. A pattern forming method for having a drawing pattern exposed to a drawing area on a specimen by irradiation with a charged particle beam, the method comprising the steps of:

dividing said drawing pattern subject to exposure into a plurality of smaller regions while calculating an area value of said drawing pattern in each smaller region;

correcting the area value of each smaller region by use of a weighted sum of the area values calculated for proximate smaller regions surrounding the smaller region in question;

computing a dose of exposure for each smaller region on the basis of the corrected area values;

generating supplementary exposure geometries in regard to said divided smaller regions;

based on the corrected area values, computing doses of supplementary exposure for the generated supplementary exposure geometries by irradiation with said charged particle beam;

performing supplementary exposure by irradiating said drawing area with said charged particle beam on the basis of the computed doses of supplementary exposure; and performing main exposure by irradiating a region constituted by said drawing pattern with said charged particle beam on the basis of the computed dose of exposure for each small region;

wherein pattern exposure doses of said irradiated charged particle beam in said step of computing doses of supplementary exposure and computing the dose of exposure for each smaller region are determined such that a median of cumulative energy levels at fluctuating pattern densities remains constant.

11. A charged particle beam drawing apparatus for having a drawing pattern exposed to a drawing area on a specimen by irradiation with a charged particle beam, the apparatus comprising:

a charged particle beam exposing unit which performs supplementary exposure by irradiating said drawing area on said specimen with said charged particle beam, and which performs main exposure by irradiating with said charged particle beam a region constituted by said drawing pattern inside said drawing area on said specimen; and a exposure dose computing unit which divides said drawing area into a plurality of smaller regions; which obtains an area ratio of a drawing pattern region to a non-drawing pattern region in each of the divided smaller regions; and which computes a dose of said supplementary exposure to be smaller and a dose of said main exposure to be larger for a divided smaller region where said area ratio is relatively low than for a divided smaller region where said area ratio is relatively high;

wherein pattern exposure doses of said irradiated charged particle beam computed by said exposure dose computing unit are determined such that a median of cumulative energy levels at fluctuating pattern densities remains constant.

12. A charged particle beam drawing apparatus according to claim 11, wherein said charged particle beam exposing unit performs said supplementary exposure before executing said main exposure.

* * * * *

UNITED STATES PATENT AND TRADEMARK OFFICE
CERTIFICATE OF CORRECTION

PATENT NO. : 6,831,283 B2
DATED : December 14, 2004
INVENTOR(S) : Haruo Yoda et al.

It is certified that error appears in the above-identified patent and that said Letters Patent is hereby corrected as shown below:

Column 20,
Line 19, change "aid" to -- said --.

Signed and Sealed this

Fifth Day of July, 2005

JON W. DUDAS
*Director of the United States Patent and Trademark Office*